United States Patent
Tyan et al.

(10) Patent No.: US 7,183,707 B2
(45) Date of Patent: Feb. 27, 2007

(54) OLED DEVICE WITH SHORT REDUCTION

(75) Inventors: Yuan-Sheng Tyan, Webster, NY (US); Giuseppe Farruggia, Webster, NY (US); Thomas R. Cushman, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 222 days.

(21) Appl. No.: 10/822,517

(22) Filed: Apr. 12, 2004

(65) Prior Publication Data

US 2005/0225234 A1    Oct. 13, 2005

(51) Int. Cl.
*H01J 1/62* (2006.01)
*H01J 63/04* (2006.01)

(52) U.S. Cl. .................... 313/504; 313/506
(58) Field of Classification Search ........... 313/502, 313/503, 504, 506, 512
See application file for complete search history.

(56) References Cited

U.S. PATENT DOCUMENTS

| | | | |
|---|---|---|---|
| 4,769,292 A | | 9/1988 | Tang et al. |
| 6,713,955 B1 * | | 3/2004 | Roitman et al. ............ 313/504 |
| 6,866,946 B2 * | | 3/2005 | Cao et al. .................. 428/690 |

FOREIGN PATENT DOCUMENTS

| | | |
|---|---|---|
| EP | 1 003 229 | 5/2000 |
| EP | 1 388 894 | 2/2004 |
| JP | 09 063771 | 3/1997 |
| JP | 2002-100483 | 4/2002 |
| JP | 2002-208479 | 7/2002 |
| WO | WO 2004/013073 | 2/2004 |

OTHER PUBLICATIONS

Tang et al, Organic electroluminescent diodes, Appl. Phys. Let. 51 (12) Sep. 1987, pp. 913-915.
Tokito et al, Metal oxides as a hole-injecting layer for an organic electroluminescent device, J. Phys. D:Appl. Phys. 29 (1996k) 2750-2753).
Tang et al, Electroluminescence of doped organic thin films, J. Appl. Phys 65(9) May 1989, p. 3610-3616.
Pal et al (American Physics Society, OFM96 Conference Abstracts CE.07).
T. Minami, New n-type transparent conducting oxides, MRS Bulletin, Aug. 2000, pp. 38-43.
Yagliioglu et al.: Crystallization of amorphous $in_2O_3$-10 wt % ZnO thin films annealed in air; 2005; *Applied Physics Letters 86*, 261908 (2005), col. 1, lines 11-16.
Kitamura et al.: Improved Light Outcoupling In Organic Electroluminescent Devices With Random Lots; *Japanese Journal of Applied Physics*; vol. 44, No. 1B, 2005, pp. 613, col. 2, lines 14-16.
Chen, A Modified Transparent Conducting Oxide for Flat Panel Displays Only, *Jpn. J. Appl. Phys.* vol. 40 (2001), p. 1285, Table 1.
Jung et al.: Infulence Of DC Magnetron Sputtering Parameters On The Propertues Of Amorphous Indium Zinc Oxide Thin Film; *Thin Solid Films 445* (2003) pp. 63-71.

* cited by examiner

*Primary Examiner*—Edward J. Glick
*Assistant Examiner*—Thomas R. Artman
(74) *Attorney, Agent, or Firm*—Raymond L. Owens (57) ABSTRACT

Various OLED display and device structures are disclosed which reduce shorting.

18 Claims, 3 Drawing Sheets

OLED DEVICE WITH SHORT REDUCTION

FIELD OF THE INVENTION

The present invention relates to short reduction in OLED devices and displays.

BACKGROUND OF THE INVENTION

Organic electroluminescent (EL) devices or organic light-emitting diodes (OLEDs) are electronic devices that emit light in response to an applied potential. Tang et al. in Applied Physics Letters 51, p913, 1987; Journal of Applied Physics, 65, p3610, 1989; and commonly assigned U.S. Pat. No. 4,769,292 demonstrated highly efficient OLEDs. Since then, numerous OLEDs with alternative layer structures, including polymeric materials, have been disclosed and device performance has been improved.

OLEDs are thin-film devices comprising an anode, a cathode, and an organic EL element disposed between the anode and the cathode. In operation, an electrical voltage is applied between the anode and the cathode causing electrons to inject from the cathode and holes to inject from the anode. When properly constructed, the injected electrons and holes recombine in the light emitting layer within the organic EL element and the recombination of these charge carriers causes light to emit from the device. Typically, the organic EL element is about 100~500 nm in thickness, the voltage applied between the electrodes is about 3~10 volts, and the operating current is about 1~20 mA/cm$^2$.

Because of the small separation between the anode and the cathode, the OLED devices are prone to shorting defects. Pinholes, cracks, steps in the structure of OLED devices, and roughness of the coatings, etc. can cause direct contacts between the anode and the cathode or to cause the organic layer thickness to be smaller in these defective areas. These defective areas provide low resistance pathways for the current to flow causing less or, in the extreme cases, no current to flow through the organic EL element. The luminous output of the OLED devices is thereby reduced or eradicated. In a multi-pixel display device, the shorting defects could result in dead pixels that do not emit light or emit below average intensity of light causing reduced display quality. In lighting or other low resolution applications, the shorting defects could result in a significant fraction of area non-functional. Because of the concerns on shorting defects, the fabrication of OLED devices is typically done in clean rooms. But even a clean environment cannot be effective in eliminating the shorting defects. In many cases the thickness of the organic layers is also increased to beyond what is actually needed for functioning devices in order to increase the separation between the two electrodes to reduce the number of shorting defects. These approaches add costs to OLED device manufacturing, and even with these approaches the shorting defects cannot be totally eliminated.

JP2002100483A discloses a method to reduce the shorting defect due to local protrusions of crystalline transparent conductive films of an anode by depositing an amorphous transparent conductive film over the crystalline transparent conductive film. It alleged that the smooth surface of the amorphous film could prevent the local protrusions from the crystalline films from forming shorting defects or dark spots in the OLED device. The effectiveness of the method is doubtful since the vacuum deposition process used to produce the amorphous transparent conductive films does not have leveling functions and the surface of the amorphous transparent conductive films is expected to replicate that of the underlying crystalline transparent conductive films. Furthermore, the method does not address the pinhole problems due to dust particles, flakes, structural discontinuities, or other causes that are prevalent in OLED manufacturing processes.

JP2002208479A discloses a method to reduce shorting defects by laminating an intermediate resistor film made of a transparent metal oxide of which, the film thickness is 10 nm–10 μm, the resistance in the direction of film thickness is 0.01–2 Ω-cm2, and the ionization energy at the surface of the resistor film is 5.1 eV or more, on the whole or partial of light emission area on a positive electrode or a negative electrode formed into transparent electrode pattern which is formed on a transparent substrate made of glass or resin. While the method has its merits, the specified resistivity range can not effectively reduce leakage due to shorting in many OLED displays or devices. Furthermore, the ionization energy requirement severely limits the choice of materials and it does not guarantee appropriate hole injection that is known to be critical to achieving good performance and lifetime in OLED devices. Furthermore, the high ionization energy materials can not provide electron injection and therefore cannot be applied between the cathode and the organic light emitting layers. It is often desirable to apply the resistive film between the cathode material and the organic light emitting layers or to apply the resistive film both between the cathode and the organic light emitting materials and between the anode and the organic light emitting materials.

SUMMARY OF THE INVENTION

It is therefore an object of the present invention to provide an improved OLED device or display with reduced leakage current due to shorting defects.

This object is achieved by an OLED device comprising:
(a) a substrate;
(b) a first electrode layer disposed over the substrate;
(c) an inorganic short reduction layer disposed over the first electrode layer;
(d) a charge injection layer disposed over the inorganic short reduction layer;
(e) an organic EL element disposed over the charge injection layer; and
(f) a second electrode layer over the organic EL element, wherein the short reduction layer is selected to have a thickness and resitivity sufficient to reduce the leakage current and the associated loss of emission efficiency due to shorting defects.

It is an advantage of the present invention that when shorts occur their effects can be minimized.

DETAILED DESCRIPTION OF THE PREFERRED EMBODIMENTS

Figure 1:
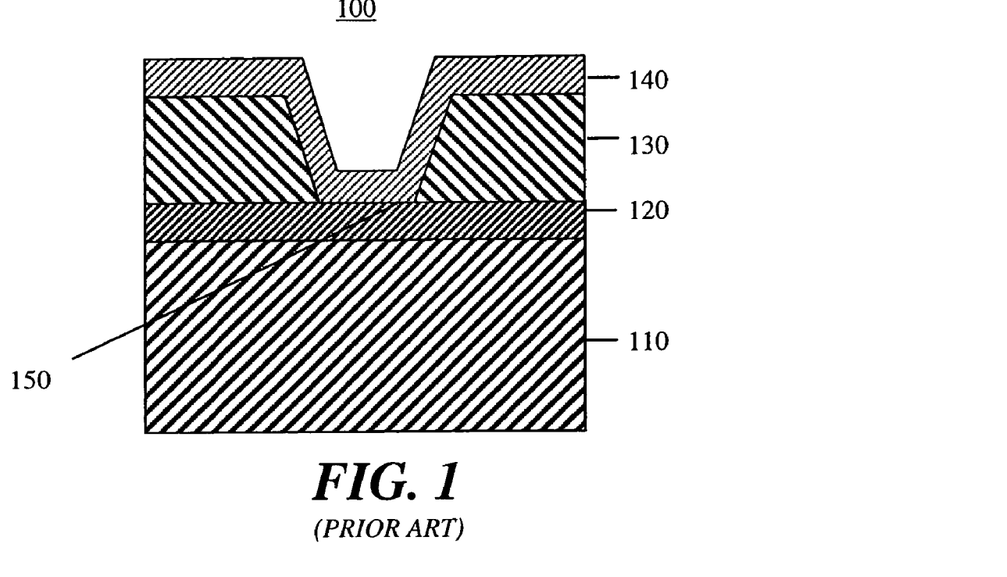
FIG. 1 is a schematic cross-sectional view of a prior art device with a shorting defect.

FIG. 1 shows schematically a shorting defect in a prior art OLED device 100. Device 100 includes a substrate 110, a first electrode layer 120, an organic EL element 130, and a second electrode layer 140. One of the electrode layers is the anode and the other electrode layer is the cathode. There are frequently other layers over the second electrode layer 140 for mechanical protection or other purposes, and often there is an organic or inorganic electron injection layer between the cathode and organic EL element 130 and an organic or inorganic hole injection layer between the anode and organic EL element 130.

For bottom emitting OLED devices, substrate 110 is transparent to the light emitted by OLED device 100. Common materials for substrate 110 are glass or plastic. First electrode layer 120 is also transparent to the emitted light. Common materials for first electrode layer 120 are transparent conductive oxides such as Indium-Tin Oxide (ITO) or Indium-Zinc Oxide (IZO), etc. Alternatively, first electrode layer 120 can be made of a semi-transparent metal such as Ag, Au, Mg, Ca, or alloys there of. When semi-transparent metal is used as first electrode layer 120, OLED device 100 is said to have a microcavity structure. Organic EL element 130 includes at least a light emitting layer (LEL) but frequently also includes other functional layers such as an electron transport layer (ETL), a hole transport layer (HTL), an electron blocking layer (EBL), or a hole blocking layer (HBL), etc. The discussion that follows is independent of the number of functioning layers and independent of the materials selection for the organic EL element 130. Second electrode layer 140 is usually a reflecting metal layer such as Al, Ag, Au, Mg, Ca, or alloys thereof. Often a hole injection layer is added between organic EL element 130 and the anode and often an electron injection layer is added between organic EL element 130 and the cathode. In operation a positive electrical potential is applied to anode and a negative potential is applied to the cathode. Electrons are injected from the cathode into organic EL element 130 and driven by the applied electrical field to move toward the anode; holes are injected from the anode into organic EL element 130 and driven by the applied electrical field to move toward the cathode. When electrons and holes combine in organic EL element 130, light is generated and emitted by OLED device 100.

For top emitting OLED devices, light is emitted opposite to the direction of substrate 110. In such cases substrate 110 can be opaque to the emitted light and materials such as metal or Si can be used, the first electrode layer 120 can be opaque and reflective, and the second electrode layer 140 needs to be transparent or semitransparent.

Also shown schematically in FIG. 1 is a shorting defect 150 created by a region that is lack of organic materials in organic EL element 130. The discussion that follows also pertains to shorting defects caused by regions having substantially smaller thickness of organic materials in organic EL element 130 when compared with the rest of the device areas. There are many possible causes of shorting defects. For example, dust particles or flakes on the substrate 110 could locally block the flow of materials during the deposition of organic EL element 130 causing gaps or substantially smaller thicknesses in the organic films that leads to reduced electrical resistance between the first electrode layer 120 and the second electrode layer 140 deposition. The particles or flakes could come from the air before the substrates were loaded into the vacuum chamber or they could be generated during the first electrode layer 120 or organic deposition processes because of spitting of particles of source materials from the boat or because of de-lamination of deposits from the deposition chamber walls and fixtures. These particles or flakes may also fall off during or after the deposition of the organic layers because of mechanical vibration or stress in the organic deposits, or simply because of gravity. The particles or flakes that are present on the substrate 110 during the organic deposition process and subsequently fall off can cause the most damage. In this case they block the organic materials from depositing onto the substrate 110 and when they fall off they leave an area of the first electrode layer 120 completely exposed to the later deposition of the second electrode layer 140.

Other sources of shorting defects include steps in the OLED device structure, for example those associated with the TFT (thin-film transistor) structure in an active matrix OLED display device, that cannot be completely covered by organic layers or rough textures on the surface of substrate 110 or the surface of first electrode layer 120. Shorting defect 150 causes second electrode layer 140 to contact directly or through a much smaller thickness of organic layers to first electrode layer 120 and provides a low resistance path to the device current. When an electrical voltage is applied between the anode and the cathode, a sizable electrical current, hereto referred to as a leakage current, can flow from the anode to the cathode through shorting defect 150 bypassing the defect free area of the device. Shorting defects can thereby substantially reduce the emission output of OLED device 100 and in many cases they can cause OLED device 100 to become not emitting altogether.

Figure 2:
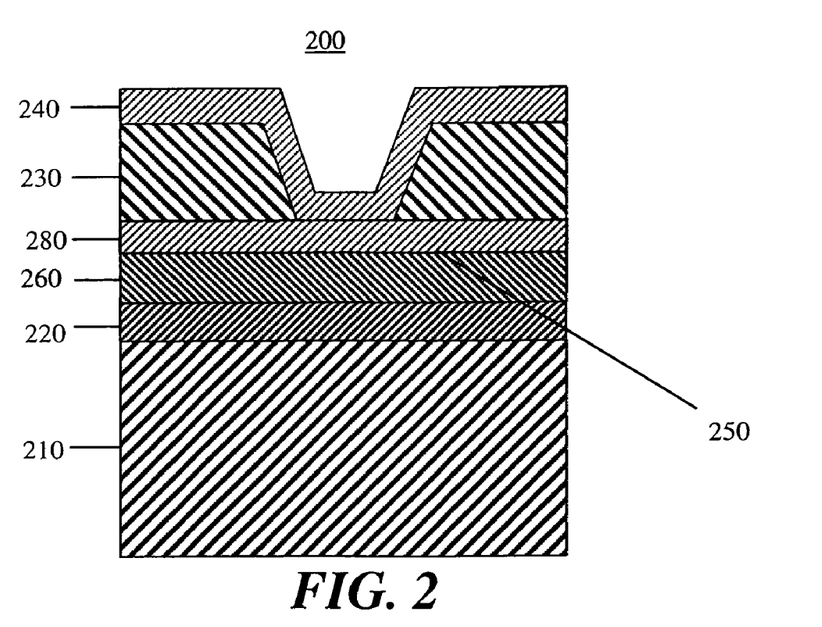
FIG. 2 is a schematic cross-sectional view of an OLED device in accordance with the present invention.

FIG. 2 shows schematically an OLED device 200 according to one embodiment of the present invention. OLED device 200 includes a substrate 210, a first electrode layer 220, an organic EL element 230, and a second electrode layer 240. Disposed between first electrode layer 220 and organic EL element 230 is a short reduction layer (SRL) 260 and a charge injection layer 280. If first electrode layer 220 is the anode, charge injection layer 280 is a hole injection layer; if first electrode layer 220 is the cathode, charge injection layer 280 is an electron injection layer. In FIG. 2, charge injection layer 280 is shown to cover shorting defect 250. In many cases, charge injection layer 280 can also be absent at shorting defect 250. This absence of charge injection layer 280 at shorting defect 250 may happen, for example, if charge injection layer 280 is coated as part of the organic layer coating process or if shorting defect 250 is caused by roughness of the surface of substrate 200 or first electrode layer 220. Since the charge injection layer 280 is usually very thin, on the order of a few nanometers or less, it does not contribute much to the resistance through the shorts in either case and will not affect the discussions that follow.

When an OLED device is constructed in accordance with the present invention, where there is a shorting defect 250 in organic EL element 230, second electrode layer 240 does not contact first electrode layer 220 directly in the pinhole, but through short reduction layer 260. Short reduction layer 260 when properly chosen can add a resistance term $R_{srl}$ between first electrode layer 220 and second electrode layer 240 that substantially reduces the leakage current through shorting defect 250. The effectiveness of the present invention is analyzed as follows: let A be the area in $cm^2$ of OLED device 200, α be the total area in $cm^2$ of all shorting defects in OLED device 200, t be the thickness in centimeter and ρ be the bulk resistivity in ohms-cm of short reduction layer 260, $I_o$ be the operating current density in mA/cm² and $V_o$ be the operating voltage in volts of OLED device 200, the current that flows through the shorting defects can be calculated as:

$$I_o = 1000 \times \frac{V_o}{\rho \cdot \frac{t}{a}} = 1000 \times \frac{aV_o}{\rho t} \qquad \text{Equation 2}$$

The short reduction layer 260 reduces the negative impacts of shorting defect 250 and raises the device performance to an acceptable level. The negative impact of shorting defects can be measured by a parameter f, ratio of the leakage current that flows through the shorting defects to the total device current:

$$f = 1000 \times \frac{aV_o/\rho t}{I_o A} = 1000 \times \frac{aV_o}{\rho t I_o A} \qquad \text{Equation 2}$$

To achieve an acceptable ratio $f_o$, the short reduction layer 260 needs to have a minimum through-thickness resistivity ρt of $$\rho \cdot t \geq 1000 \times \frac{aV_o}{f_o I_o A} \qquad \text{Equation 3}$$

The selection of materials that can be used as an effective short reduction layer 260 depends therefore on the area A; the operatinug condition of OLED device 200, $V_o$ and $I_o$; the level of performance loss that can be tolerated, $f_o$; the total area of shorting defects, α; and the thickness of short reduction layer 260, t, that can be incorporated into the device.

The thickness of short reduction layer 260 is selected based on two considerations: 1). Typical OLED devices have total organic layer thickness of about 100–300 nm and the layer thickness is optically tuned to optimize the emission efficiency of the device. A short reduction layer becomes a part of the optical structure of the device and hence its thickness should not be over about 200 nm. Too thick a short reduction layer also increases manufacturing cost of the OLED device. 2) The short reduction layer needs to be thick enough to effectively cover the shorting defects. A reasonable lower limit is about 20 nm. The present invention prefers a short reduction layer in the thickness range of 20 nm to 200 nm.

OLED devices are being used for many different applications. These OLED devices can have vastly different device area and operating conditions. For example, for lighting applications the OLED device tends to be divided into large light emitting segments (U.S. Pat. No. 6,693,296), greater than one centimeter squared, that operate at relatively few levels of current densities. For area color displays, the pixels are smaller, maybe on the order of square millimeters, and the operating conditions again do not varied a lot. For high resolution pixilated OLED displays, either on active matrix or passive matrix back planes, the pixels are much smaller, on the order of 0.3 mm×0.3 mm or smaller, and, in addition, the OLED devices need to provide a dynamic range. For an eight bit resolution the device operating current needs to have a range of 1× to 256×. Equation 3 suggests that these different OLED devices will require vastly different materials as the short reduction layer.

EXAMPLE 1

As an illustration of the short reduction layer selection, the impact of shorting defects on a single pixel in a high resolution pixilated OLED display is analyzed. The analysis assumes the existence of one shorting defect of a certain size in a pixel. The results of the analysis will be the same if instead there are several smaller shorting defects, such as those caused by roughness of the substrate or the first electrode layer, with the same total area as the single defect. The size of the pixels is assumed to be 0.1 mm×0.1 mm and the size of the defect is 1 μm×1 μm, typical of the size of dust particles.

A state of the art bottom emitting active matrix OLED display has about 200 cd/m² luminance at full brightness. This brightness is achieved from an OLED display having an aperture ratio of about 0.25 and through a polarizer film of about 50% transmittance. The actual brightness at the OLED device surface at full brightness is therefore about 1600 cd/m². With an eight-bit color depth, the OLED device needs also to operate down to about 6.3 cd/m². The efficiency of a state-of-the-art OLED device is about 10 cd/A and the operating voltage is about 10 volts. This means the device has to operate from about 0.063 mA/cm² to about 16 mA/cm². For this and the following examples, the device operating voltage is assumed to be independent of the operating current. In most real devices the operating voltage varies with the logarithm of the operating current. Over the about the two and half decade operating current range considered in these examples, the constant voltage assumption is therefore a reasonable and conservative assumption. The resistivity of a 20 nm thick short reduction layer film needed to effectively reduce leakage in the OLED display against defect sizes of about 1 μm×1 μm is calculated and the calculated results are tabulated in Table 1. Also listed in Table 1 are the increase in series resistance due to the short reduction layer and the sheet resistivity of the short reduction layer. The latter values are needed to evaluate possible cross talk between pixels.

TABLE 1

| Brightness cd/m2 | Operating current density mA/cm2 | Equivalent resistance of device ohms | Resistance through shorts with SRL ohms | Through-thickness resistivity of SRL ohm-cm2 | Bulk resistivity of SRL needed ohm-cm | Series resistance due to SRL ohms | Sheet resistivity of SRL ohms/square |
|---|---|---|---|---|---|---|---|
| 1600 | 16 | 6.25E+06 | 6.25E+07 | 6.25E−01 | 3.13E+05 | 6.25E+03 | 1.56E+11 |
| 800 | 8 | 1.25E+07 | 1.25E+08 | 1.25E+00 | 6.25E+05 | 1.25E+04 | 3.13E+11 |
| 400 | 4 | 2.50E+07 | 2.50E+08 | 2.50E+00 | 1.25E+06 | 2.50E+04 | 6.25E+11 |

TABLE 1-continued

| Brightness cd/m2 | Operating current density mA/cm2 | Equivalent resistance of device ohms | Resistance through shorts with SRL ohms | Through-thickness resistivity of SRL ohm-cm2 | Bulk resistivity of SRL needed ohm-cm | Series resistance due to SRL ohms | Sheet resistivity of SRL ohms/square |
|---|---|---|---|---|---|---|---|
| 200 | 2 | 5.00E+07 | 5.00E+08 | 5.00E+00 | 2.50E+06 | 5.00E+04 | 1.25E+12 |
| 100 | 1 | 1.00E+08 | 1.00E+09 | 1.00E+01 | 5.00E+06 | 1.00E+05 | 2.50E+12 |
| 50 | 0.5 | 2.00E+08 | 2.00E+09 | 2.00E+01 | 1.00E+07 | 2.00E+05 | 5.00E+12 |
| 25 | 0.25 | 4.00E+08 | 4.00E+09 | 4.00E+01 | 2.00E+07 | 4.00E+05 | 1.00E+13 |
| 12.5 | 0.125 | 8.00E+08 | 8.00E+09 | 8.00E+01 | 4.00E+07 | 8.00E+05 | 2.00E+13 |
| 6.25 | 0.0625 | 1.60E+09 | 1.60E+10 | 1.60E+02 | 8.00E+07 | 1.60E+06 | 4.00E+13 |

The first column lists several brightness levels in cd/m$^2$ representing the eight bit brightness resolution; the second column lists the operating current density of the OLED device at these levels; the third column lists the equivalent device resistance values of an OLED pixel at these levels; the fourth column lists the resistance of the shorting defects with the SRL in place if the leakage current is 10% of the operating current, these resistance values are ten times of the corresponding values in column three; column five lists the corresponding through-thickness resistivity of the SRL, these values are obtained by multiplying the values of column four by the area of the shorting defects which in this calculation equals to $10^{-8}$ cm$^2$; column six lists the bulk resistivity values needed to achieve the corresponding through-thickness resistivity values in column five with the assumed SRL thickness of 20 nm used in this example; column seven lists the series resistance added by the SRL to the OLED device; and column eight lists the sheet resistivity of the SRL, if the sheet resistivity is comparable to the equivalent resistance of the device, cross-talk will become a problem.

Table 1 shows that a SRL with 10 ohm-cm$^2$ through-thickness resistivity can reduce leakage currents to below 10% level for the OLED down to about 100 cd/cm$^2$ brightness level. The leakage current through SRL of this resistivity becomes a larger fraction of device current at lower brightness, however, and at the lowest brightness it can be as high as 50% of the device current. Since this is at lower brightness, it may not be a problem for many applications. The leakage current decreases as the resistivity of SRL increases. At about 160 ohm-cm$^2$ the leakage is less than 10% of device current down to the lowest operating conditions of 6.25 cd/cm$^2$. 160 ohm-cm$^2$ is also the level above which series resistance due to SRL becomes a significant fraction of the equivalent resistance of the OLED device at the full brightness. Under the set of conditions considered in Example 1, therefore, short reduction layers with through-thickness resistivity between about 10 ohm-cm$^2$ to about 160 ohm-cm$^2$ can be used. Note that even with through-thickness resistivity at 10 ohm-cm$^2$ the sheet resistivity of the SRL is much larger than the equivalent device resistance. Cross-talk due to the short reduction layer is therefore not a concern.

EXAMPLE 2

Example 2 examines the effect of defect size on the selection of SRL. All the parameters used for Example 2 are the same as those in Example 1 except that the area of the shorting defects was varied. Table 2 shows the calculated results on how much SRL through-thickness resistivity is needed to significantly reduce leakage and how much through-thickness SRL resistivity is expected to significantly increase the series resistance of the device.

TABLE 2

| Defect Area, cm2 | Through-thickness resistivity of SRL needed to offer leakage reduction down to 100 cd/m2, ohm-cm2 | Through-thickness resistivity of SRL that causes significant series resistance, ohm-cm2 |
|---|---|---|
| 1.00E−09 | 1 | 160 |
| 1.00E−08 | 10 | 160 |
| 1.00E−07 | 100 | 160 |

The first column lists the total defect area in cm$^2$; the second column lists the through-thickness resistivity value that a SRL needs to have to reduce leakage current to less than 10% at 100 cd/m2 brightness level; the third column lists the through-thickness resistivity of SRL above which significant series resistance is added to the OLED device. Table 2 shows that when defect area increases, the through-thickness resistivity of the SRL increases proportionally. The through-thickness resistivity that causes significantly series resistance, however, stays constant. Table 2 demonstrates that the effectiveness of SRL increases with increasing through-thickness resistivity. It is much desirable to use SRL materials with as large a through-thickness resistivity as possible within the constrain of not adding too much series resistance.

EXAMPLE 3

Example 3 examines the effect of device efficiency on the selection of SRL since have been many efforts to try to improve OLED device efficiency. All the parameters used for Example 3 are the same as those in Example 1 except that the device efficiency was varied. Table 3 shows the calculated results on how much through-thickness SRL resistivity is expected to significantly increase the series resistance of the device.

TABLE 3

| Device Efficiency, cd/A | Through-thickness resistivity of SRL needed to offer leakage reduction down to 100 cd/m2, ohm-cm2 | Through-thickness resistivity of SRL that causes significant series resistance, ohm-cm2 |
|---|---|---|
| 10 | 10 | 160 |
| 20 | 20 | 320 |
| 40 | 40 | 640 |
| 80 | 80 | 1280 |

The first column lists the device efficiency in cd/A; the second column lists the through-thickness resistivity value that a SRL needs to have to reduce leakage current to less than 10% of device current at 100 cd/m² brightness level; the third column lists the through-thickness resistivity of SRL above which significant series resistance is added to the OLED device. Table 3 shows that when device efficiency improves, the through-thickness resistivity of the SRL needed to reduce leakage to less than 10% of device current at 100 cd/m² increases proportionally. The through-thickness resistivity that causes significantly series resistance also increases proportionally. For an OLED device with a given device efficiency a SRL film with a through-thickness resistivity value between the two values in these columns can be used to reduce the leakage without significant series resistance problem. As discussed in Example 2, however, it is desirable to use as high a through thickness resistivity value as possible in this range to increase the effectiveness of SRL against larger size defects.

EXAMPLE 4

This example examines the effect of operating voltage on the selection of SRL. Since the operating voltage relates directly to the power efficiency of an OLED device, there have been many efforts to try to reduce the operating voltages. All the parameters used for Example 4 are the same as those in Example 1 except that the operating voltage of the device was varied. Equation 3 was used to calculate how much SRL through-thickness resistivity is needed to significantly reduce leakage and how much through-thickness SRL resistivity is expected to significantly increase the series resistance of the device. Table 4 shows the calculated results:

TABLE 4

| Device Operating Voltage, volts | Through-thickness resistivity of SRL needed to offer leakage reduction down to 100 cd/m2, ohm-cm2 | Through-thickness resistivity of SRL that causes significant series resistance, ohm-cm2 |
| --- | --- | --- |
| 3 | 3 | 48 |
| 4 | 4 | 64 |
| 5 | 5 | 80 |
| 10 | 10 | 160 |

The first column lists the device operating voltage; the second column lists the through-thickness resistivity value that a SRL needs to have to reduce leakage current to less than 10% of device current at 100 cd/m2 brightness level; the third column lists the through-thickness resistivity of SRL above which significant series resistance is added to the OLED device. Table 4 shows that when device operating voltage decreases, the through-thickness resistivity of the SRL needed to reduce leakage to less than 10% of device current at 100 cd/m² also decreases proportionally. The through-thickness resistivity that causes significantly series resistance also decreases proportionally. For an OLED device with a given operating voltage a SRL film with a through-thickness resistivity between the two values in these columns can be used to reduce the leakage without significant series resistance problem. As demonstrated in Example 2, however, it is desirable to use as high a through thickness resistivity value as possible in this range to increase the effectiveness of SRL against larger size defects.

EXAMPLE 5

Example 5 examines the effect of OLED device size on the selection of SRL. For the examples under consideration, a single pixel is the OLED device. All the parameters used for Example 5 are the same as those in Example 1 except that the device size was varied. Equation 3 was used to calculate how much SRL through-thickness resistivity is needed to significantly reduce leakage and how much through-thickness SRL resistivity is expected to significantly increase the series resistance of the device. Table 5 shows the calculated results:

TABLE 5

| Device Size, cm2 | Through-thickness resistivity of SRL needed to offer leakage reduction down to 100 cd/m2, ohm-cm2 | Through-thickness resistivity of SRL that causes significant series resistance, ohm-cm2 |
| --- | --- | --- |
| 1.00E−03 | 1 | 160 |
| 1.00E−04 | 10 | 160 |
| 1.00E−05 | 100 | 160 |

The first column lists the device size in cm²; the second column lists the through-thickness resistivity value that a SRL needs to have to reduce leakage current to less than 10% of device current at 100 cd/m2 brightness level; the third column lists the through-thickness resistivity of SRL above which significant series resistance is added to the OLED device. For an OLED device of a given size a SRL film with a through-thickness resistivity between the two values in these columns can be used to reduce the leakage without significant series resistance problem. As demonstrated in Example 2, however, it is desirable to use as high a through thickness resistivity value as possible in this range to increase the effectiveness of SRL against larger size defects. Table 5 shows that the smaller the device or pixel size the higher is the through-thickness resistivity of SRL needed for leakage reduction.

EXAMPLE 6

Example 6 examines the short reduction layer design for an OLED device having one or more large light emitting segments. For the present application a large light emitting segment is one having an area of 0.1 cm² or larger. One example of such device is a large area passive matrix OLED device having pixel sizes of 0.1 cm² or larger. Another example is an OLED lighting or illumination devices having a subdivided monolithic serial connection structure as described in U.S. Pat. No. 6,693,296 wherein the light emitting segments are 0.1 cm² or larger. Usually these devices are operated only over a limited range of luminance levels. Equation 3 applies equally well to these OLED devices and suggests very different requirements of through-thickness resistivity values from those needed for high resolution displays. In this example an OLED device with large light emitting segments for illumination applications is examined. To be competitive with the commercially available compact florescent lamps, the OLED device needs to have a power efficiency of about 40 lm/W operating at about 2000 cd/m². This kind of high power efficiency level is most likely achieved through a drive voltage reduction and an increase in the current efficiency. If the drive voltage is reduced to 3 volts, close to the theoretical limit for a white light emitting device, the current efficiency of the device needs to be about 40 cd/A since OLED devices are near Lambertian in their emission patterns. If we again allow 10% leakage loss due to shorting defects of about $10^{-8}$ cm$^2$ total area, the resistivity requirements of a 20 nm thickness short reduction layer can be calculated and the results are tabulated in Table 6.

10 cm$^2$ light emitting segment, the useable range of through-thickness resistivity is reduced to $6\times10^{-6}$ to $6\times10^{-1}$ ohm-cm$^2$; and for a 100 cm2 light emitting segment this range is reduced further to $6\times10^{-7}$ to $6\times10^{-3}$ ohm-cm$^2$.

The above examples show that for high resolution displays the through thickness resistivity range needs to be in the range of about 10–1600 ohm-cm$^2$, and most preferably,

TABLE 6

| Segment Size cm2 | Equivalent resistance of segment, ohms | Resistance through shorts with SRL for 10% leakage, ohms | Through-thickness resistivity of SRL, ohm-cm2 | Bulk resistivity of SRL needed, ohm-cm | Series resistance due to SRL, ohms | Maximum through-thickness resistivity of SRL based on 10% delta, ohm-cm2 | Sheet resistivity of SRL ohms/square |
|---|---|---|---|---|---|---|---|
| 0.1 | 6.00E+03 | 6.00E+04 | 6.00E−04 | 6.00E+01 | 6.00E−03 | 6.00E+03 | 6.00E+06 |
| 1 | 6.00E+02 | 6.00E+03 | 6.00E−05 | 6.00E+00 | 6.00E−05 | 6.00E+01 | 6.00E+05 |
| 10 | 6.00E+01 | 6.00E+02 | 6.00E−06 | 6.00E−01 | 6.00E−07 | 6.00E−01 | 6.00E+04 |
| 100 | 6.00E+00 | 6.00E+01 | 6.00E−07 | 6.00E−02 | 6.00E−09 | 6.00E−03 | 6.00E+03 |

The first column lists the size of the light emitting segments that might be used in this OLED illumination device; the second lists the equivalent device resistance values of a light emitting segment in this OLED device; the third column lists the resistance of the shorting defects with the SRL in place if the leakage current is 10% of the operating current, these values are ten times of the corresponding values in column two; column four lists the corresponding through-thickness resistivity of the SRL, these values are obtained by multiplying the values of column three by the area of the shorting defects which in this calculation equals to $10^{-8}$ cm$^2$; column five lists the bulk resistivity values needed to achieve the corresponding through-thickness resistivity values in column four with the assumed SRL thickness of 20 nm used in this example; column six lists the series resistance added by the SRL to the OLED light emitting segment; and column seven lists the maximum through-thickness resistivity value allowed for the given light emitting segment size if the serial resistance contribution from the SLR is limited to 10% of the equivalent series resistance of the light emitting segment; column eight lists the sheet resistivity of the SRL, if the sheet resistivity is comparable to the equivalent resistance of the device cross-talk will become a problem.

Tuning to the row showing the results for a 1 cm$^2$ light emitting segment as an illustration, the calculation shows that to limit the leakage current to less than 10% of the light emitting segment operating current, the short reduction layer needs only to have a through-thickness resistivity of at about $6\times10^{-5}$ ohm-cm$^2$ corresponding to a bulk resistivity value of about 6 ohm-cm. Higher resistivity values offer more protection against shorting defects but add more to the series resistance of the OLED light emitting segment. The value in column 7, however, shows that through-thickness resistivity as high as 60 ohm-cm2 can be used without adding significant series resistance to the OLED light emitting segment. This broad range makes it easier to find or develop short reduction layer materials that may have to satisfy many other requirements for making a practical OLED device. It is important to point out that the incorporation of charge injection layer 280 in the device structure in accordance with the present invention further simplifies the search or development of short reduction materials.

Table 6 demonstrates clearly the strong dependence of resistivity requirement on light emitting segment size. For a 10–1000 ohm-cm$^2$. For OLED devices with large light emitting segments the usable range is much larger, from $10^{-7}$ to $10^3$ ohm-cm$^2$ for the range of operating parameters considered in Example 6, but may have values outside of this range with other set of operating parameters. The selection of appropriate through-thickness resitivity values can be easily calculated, however, using Equation 3.

For OLED displays or devices wherein the short reduction layer is in the path of the emitted light, the layer needs to be reasonably transparent to the emitted light to effectively to function effectively as a short reduction layer. For the purpose of the present application, reasonably transparent is defined as having 80% or more transmittance integrated over the emission bandwidth of the OLED device. If the short reduction layer is not in the path of the emitted light then it does not have to be transparent. It may even be desirable to have the short reduction layer also function as an antireflection layer for the reflecting anode or cathode to improve the contrast of an OLED display device.

Material for the short reduction layer can include inorganic oxides such as indium oxide, gallium oxide, zinc oxide, tin oxide, molybdenum oxide, vanadium oxide, antimony oxide, bismuth oxide, rhenium oxide, tantalum oxide, tungsten oxide, niobium oxide, or nickel oxide. These oxides are electrically conductive because of non-stoichiometry. The resistivity of these materials depends on the degree of non-stoichiometry and mobility. These properties as well as optical transparency can be controlled by changing deposition conditions. The range of achievable resistivity and optical transparency can be further extended by impurity doping. For example F doping of tin-oxide and indium-oxide and Al, In, or Ga doping of zinc-oxide have been found to improve the conductivity and optical transparency of these oxide. Even larger range of properties can be obtained by mixing two or more of these oxides. For example, mixtures of indium oxide and tin oxide, indium oxide and zinc oxide, zinc oxide and tin oxide, or cadmium oxide and tin oxide have been the most commonly used transparent conductors.

Most of the prior art has been focusing on high conductivity transparent conductors having bulk resistivity values of $10^{-3}$ ohm-cm or less. These materials are too conductive to be used as short reduction layers. High resistivity thin-films have also been demonstrated using these oxides for applications such as gas sensors, antistatic coatings, etc. however. Higher resistivity thin-films can be prepared by changing the composition and deposition conditions away from those optimized for high conductivity transparent conductors. Higher resistivity can also be achieved in particular using materials containing molybdenum oxide, vanadium oxide, antimony oxide, bismuth oxide rhenium oxide, tantalum oxide, tungsten oxide, niobium oxide, or nickel oxide. By properly controlling deposition conditions and by combing these oxides and mixing with the more conductive oxides such as indium oxide, gallium oxide, zinc oxide, tin oxide, etc. a wide range of resistivity values can be obtained to cover the needs for both OLED device with large light emitting segments and high resolution OLED display devices.

Other materials suitable for use as short reduction layers include mixtures of a higher conductivity oxide material with an insulating materials selected from oxides, fluorides, nitrides, and sulfidess. The resistivity of the mixture layer can be tuned to the desired range by adjusting the ratio of these two kinds of materials. For example, Pal et al. (A. M. Pal, A. J. Adorjan, P. D. Hambourger, J. A Dever, H. Fu American Physics Society, OFM96 conference abstracts CE.07) reported thin films made of a mixture of ITO with magnesium fluoride ($MgF_2$) covering a resistivity range of $3 \times 10^{-3}$ to $3 \times 10^3$ ohms-cm. These mixed thin films can be prepared by conventional thin film deposition techniques such as sputtering, evaporation, chemical vapor deposition, plasma enhanced chemical vapor deposition, etc. For the oxide films, oxygen or oxygen containing gases such as water vapor or ozone can be introduced during the deposition process to control the composition and film properties.

Minami (MRS Bulletin August 2000) gave an extensive review of the preparation and properties of conductive oxides. The author showed that most of the oxide materials above work functions between about 4.0 eV and 5.0 eV. These values are too low to function as hole injectors and too high to function as electron injectors. In cases where the selected short reduction layer material does not provide adequate charge injection the present invention applies an additional hole injection layer between the short reduction layer and the organic EL element if the first electrode is the anode and an additional electron injection layer between the short reduction layer and the organic EL element if the first electrode layer is the cathode. By adding the charge injection layer, the choice of materials for short reduction layer is expanded and it is possible to further refine the selection based on other additional requirements. Suitable materials for use as the hole-injection layer include, but are not limited to, porphyrinic compounds as described in commonly assigned U.S. Pat. No. 4,720,432, and plasma-deposited fluorocarbon polymers as described in commonly assigned U.S. Pat. No. 6,208,075. Alternative hole-injection materials reportedly useful in organic EL devices are described in EP 0 891 121 A1 and EP 1 029 909 A1 and by Tokito et al. J. Phys. D. Vol. 29, p2750, 1996 including vanadium oxide (VOx), molybdenum oxide (MoOx), nickel oxide (NiOx), etc. Electron-injection layers including those taught in U.S. Pat. Nos. 5,608,287; 5,776,622; 5,776,623; 6,137,223; and 6,140,763, the disclosures of which are here incorporated by reference, can be employed. A thin-film containing low work-function alkaline metals or alkaline earth metals, such as Li, Cs, Ca or Mg can be employed. In addition, an organic material doped with these low work-function metals can also be used effectively as the electron-injection layer. Examples are Li- or Cs-doped Alq.

In another embodiment of the present invention, the short reduction layer is disposed between the organic EL element and the second electrode layer. The short reduction effectiveness of this embodiment is similar to the embodiment wherein the short reduction layer is disposed between the organic EL element and the first electrode layer. The short reduction effectiveness can be further improved by employing a short reduction layer both between the organic EL element and the first electrode and between the organic EL element and the second electrode.

Figure 3:
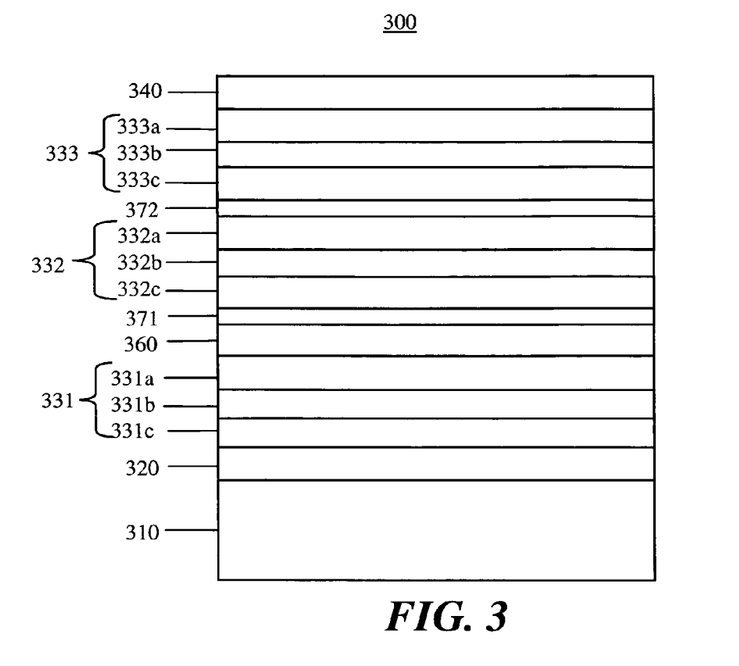
FIG. 3 is a schematic cross-sectional view of a stacked OLED device in accordance with the present invention.

In another embodiment of the present invention, the OLED device is a stacked OLED device as described in U.S. Pat. No. 6,337,492. Referring to FIG. 3, OLED device 300 is a stacked OLED device. Over a substrate 310 there are three organic light emitting devices 331, 332, 333 each respectively including a hole transport layer (331c, 332c, 333c) light emitting layer (331b, 332b, and 333b) and an electron transport layer (331a, 332a, 333a). In between the organic light emitting devices there are the connectors 371 and 372 that provide hole to the hole transport layers above them and electrons to the electron transport layers below them. In FIG. 3 short reduction layer 360 is shown disposed between the organic light emitting device 331 and connector 371, it can also be disposed between first electrode layer 320 and organic light emitting device 331; between connecter 371 and organic light emitting device 332; between organic light emitting device 332 and connecter 372; between connecter 372 and organic light emitting device 333; and between organic light emitting device 333 and second electrode layer 340. One or more short reduction layer can be used in accordance with the present invention. Again, in accordance with the present invention, a charge injection layer is advantageous if the chosen short reduction layer does not provide adequate charge injection.

In another embodiment of the present invention, the OLED device has a microcavity structure. The device includes a substrate; a metallic first anode layer, preferably selected from Au, Ag, Mg, or Ca, or alloys thereof; a short reduction layer; an organic EL element; and a metallic second electrode layer, preferably selected from Au, Al, Ag, Mg, or Ca, or alloys thereof. One of the metallic electrodes is essentially opaque and reflective, the other one is semi-transparent. Because of the presence of the two reflecting metal electrodes, the device has a microcavity structure. The strong optical interference in this structure results in a resonance condition. Emission near the resonance wavelength is enhanced and emission away from the resonance wavelength is depressed.

It is to be noted that although inorganic layers have been used in the prior art between an electrode layer and the organic EL element, the possibility of shorting defect reduction was not recognized and the spacer layers used were either too conductive or not transparent enough to function effectively as short reductions layers. For example, Tokito et al (S. Tokito, K. Noda, and Y. Taga J. Phys. D. Appl. Phys. 29 (1996) 2750–2753) reported using 30 nm sputtered thin-films of VOx, MoOx, and RuOx as hole injectors. These films were disposed in the path of the emitted light and yet the optical transparency of all these thin-films were 70% or less and the resistivity of the latter two films were much too low to function effectively as short reduction layers.

EXAMPLE 7

A series of OLED devices were made on ITO coated glass substrates. The ITO anode layers were about 42 nm thick;

deposited over the ITO layer were a short reduction layer (SRL), a 15 nm N,N'-di(naphthalene-1-yl)-N,N'-diphenyl-benzidine (NPB) layer serving as the HTL layer, a 15 nm tris(8-hydroxyquinoline)aluminum(III) (Alq) layer serving both as the ETL and the LEL; a 1 nm thick Li layer serving as the EIL, and a 100 nm thick Ag serving as the cathode layer. All the layers except ITO, which was purchased from a vendor already coated on the glass, were coated by vacuum evaporation in a chamber with a background vacuum of about $10^{-6}$ torr. Thermally evaporated $MoO_3$ layer was used as the SRL. These $MoO_3$ layers were evaporated from a Ta boat at a rate of about 0.1 nm/sec with a thickness ranging from 2 nm to 30 nm. The source material was 99.9998% $MoO_3$ powder. The composition of the films were not checked and it could deviated somewhat from the $MoO_3$ composition. The films were transparent to the visible light with about 90% transmittance and the electrical resistivity was about $10^5$ ohms-cm. After the deposition of these layers, the device was transferred from the deposition chamber into a dry box for encapsulation. The completed device structure is denoted as Glass/ITO(42)/$MoO_3$(varied)/NPB(15)/Alq (15)/Li(0.1)/Ag(100). The numbers in the parentheses are thickness in nanometers.

Altogether 12 substrates were coated, two at each $MoO_3$ thickness. On each substrate there were four 0.1 $cm^2$ OLED devices with a total of eight OLED devices at each $MoO_3$ thickness. There were a total of 48 OLED devices for this study. These devices were tested for OLED performance. Seven out of eight devices with 2 nm $MoO_3$ layer were shorted as expected since the total organic thickness of 30 nm is so thin that the devices were extremely prone to shorting defects and 2 nm of $MoO_3$ did not function adequately as a short reduction layer. The number of shorted devices decreased with increasing $MoO_3$ thickness. Only four out of thirty devices were shorted when the thickness of the $MoO_3$ layer was 12 nm or higher. These results are summarized in FIG. 5.

Figure 4:
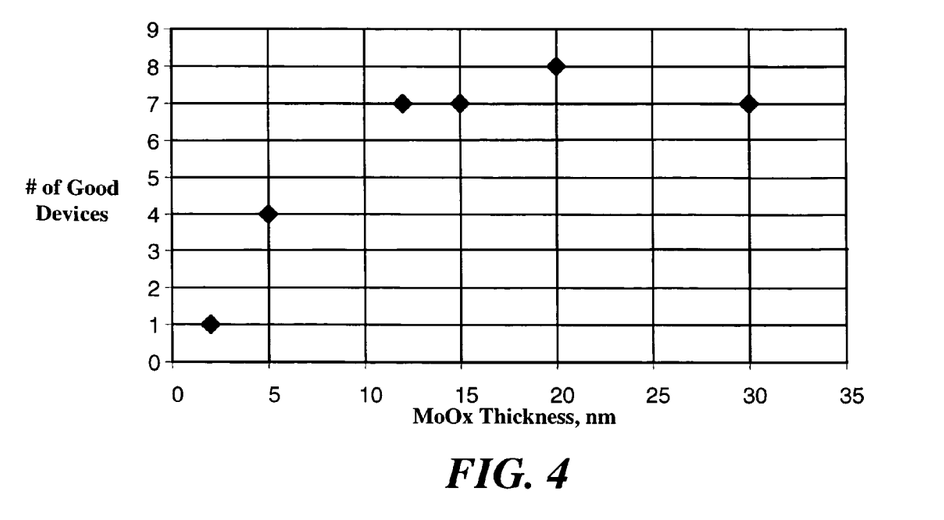
FIG. 4 is a plot showing the number of good OLED devices as a function of short reduction layer thickness.

It is to be pointed out, however, that the probability of having shorting defects in an OLED device is a strong function of the organic EL layer thickness. The smaller the organic EL layer thickness the higher the probability of having shorting defects. Typical OLED devices use organic EL layers that are over 100 nm in thickness. Frequently the thickness of the organic EL element is increased to 300 nm or higher in order to minimum the number of shorting defects. In the present example an extremely small thickness of 30 nm was used to make sure that we had adequate number of shorting defects to demonstrate the effectiveness of the short reduction layers. Data in FIG. 4 demonstrated that the short reduction was effective in reducing shorting defects in these OLED devices with extremely thin organic EL layers. The same beneficial effect is expected in OLED devices with much thicker organic EL layers.

EXAMPLE 8

Figure 5:
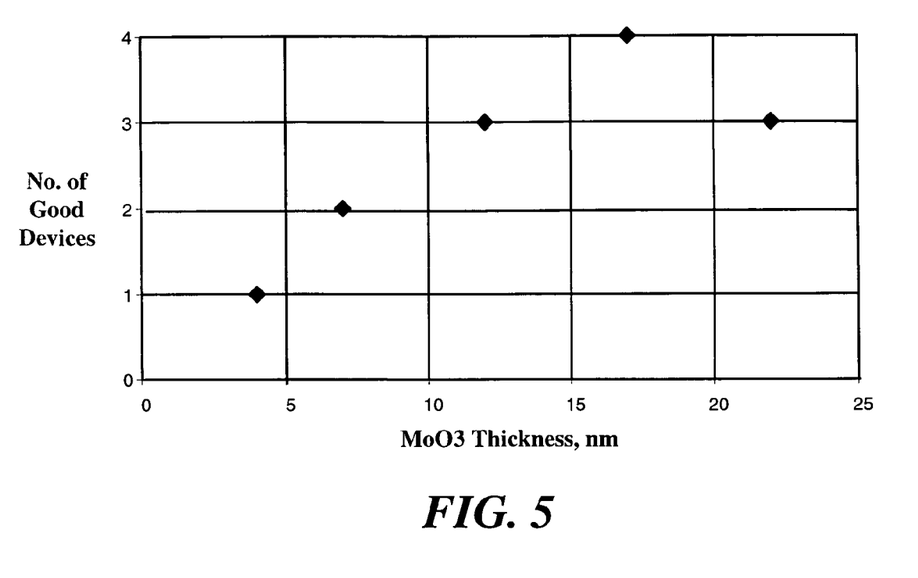
FIG. 5 is a plot showing the number of good OLED devices as a function of short reduction layer thickness.

Another series of OLED devices were made to further demonstrate the effectiveness of the short reduction layers. The fabrication condition and the layer structure of these devices were similar to those in Example 1 except that in this example the total thickness of the $MoO_3$ short reduction layer and the NPB HTL layer was kept constant at 75 nm. Five substrates were used with four OLED devices on each substrate resulted in a total of twenty 0.1 $cm^2$ OLED devices being made. In FIG. 5 the number of non-shorted devices was plotted against the $MoO_3$ short reduction layer thickness. Again, it is clear that the number of non-shorted devices increased with increasing $MoO_3$ layer thickness. It is to be pointed out that in this case the thickness of the organic EL layer actually decreased with increasing $MoO_3$ thickness, which should have increased shorting probability. The opposite trend observed in the actual data indicated that the benefit of the short reduction layer more than overcame the increased shorting probability due to reduced organic layer thickness.

The invention has been described in detail with particular reference to certain preferred embodiments thereof, but it will be understood that variations and modifications can be effected within the spirit and scope of the invention.

PARTS LIST 100, 200, 300 OLED devices
110, 210, 310 substrates
120, 220, 320 first electrode layers
130, 230 organic EL layers
140, 240, 340 second electrode layers
150, 250 shorting defects
260 short reduction layer
280 charge injection layer
331, 332, 333 organic light emitting devices
331a, 332a, 333a electron transport layers
331b, 332b, 333b light emitting layers
331c, 332c, 333c hole transport layers
360 short reduction layer
371, 372 connectors

The invention claimed is:

1. A high resolution pixilated OLED display comprising:
   (a) a substrate;
   (b) a first electrode layer disposed over the substrate;
   (c) an inorganic short reduction layer disposed over the first electrode layer, wherein the short reduction layer is selected to have a through-thickness resistivity between 10 ohm-$cm^2$ to 1500 ohm-$cm^2$;
   (d) an organic EL element disposed over the short reduction layer;
   (e) a second electrode layer over the organic EL element.

2. The OLED display of claim 1 wherein a charge injection layer is disposed between the inorganic short reduction layer and the organic EL element.

3. The OLED display of claim 1 wherein the short reduction layer is selected from indium oxide, gallium oxide, zinc oxide, tin oxide, molybdenum oxide, vanadium oxide, antimony oxide, bismuth oxide, rhenium oxide, tantalum oxide, tungsten oxide, niobium oxide, or nickel oxide.

4. The OLED display of claim 3 wherein the short reduction layer is a mixture of at least two of the listed oxides.

5. The OLED display of claim 3 wherein the short reduction layer is a mixture of at least one of the listed oxide materials and an electrically insulating oxide, fluoride, nitride, or sulfide material.

6. The OLED display of claim 1 wherein one of the two electrode layers is a transparent conductive oxide layer and the other electrode layer is metallic.

7. The OLED display of claim 1 wherein both electrode layers are metallic and at least one of the two electrode layers is semitransparent to the emitted light.

8. The OLED display of claim 1 wherein the short reduction layer is 5 nm or more in thickness.

9. The OLED display of claim 1 wherein the short reduction layer is between 20 nm and 200 nm in thickness.

10. An OLED device having one or more large light emitting light emitting segments, comprising:
   (a) a substrate;
   (b) a first electrode layer disposed over the substrate;
   (c) an inorganic short reduction layer disposed over the first electrode layer, wherein the short reduction layer is selected to have a through-thickness resistivity is between $10^{-2}$ ohm-cm$^2$ to $10-7$ ohm-cm$^2$;
   (d) an organic EL element disposed over the short reduction layer; and
   (e) a second electrode layer over the organic EL element.

11. The OLED device of claim 10 wherein a charge injection layer is disposed between the inorganic short reduction layer and the organic EL element.

12. The OLED device of claim 10 wherein the short reduction layer is selected from indium oxide, gallium oxide, zinc oxide, tin oxide, molybdenum oxide, vanadium oxide, antimony oxide, bismuth oxide, rhenium oxide, tantalum oxide, tungsten oxide, niobium oxide, or nickel oxide.

13. The OLED device of claim 12 wherein the short reduction layer is a mixture of at least two of the listed oxides.

14. The OLED device of claim 12 wherein the short reduction layer is a mixture of at least one of the listed oxide materials and an electrically insulating oxide, fluoride, nitride, or sulfide material.

15. The OLED device of claim 10 wherein one of the two electrode layers is a transparent conductive oxide layer and the other electrode layer is metallic.

16. The OLED device of claim 10 wherein both electrode layers are metallic and at least one of the two electrode layers is semitransparent to the emitted light.

17. The OLED device of claim 10 wherein the short reduction layer is 5 nm or more in thickness.

18. The OLED device of claim 10 wherein the short reduction layer is between 20 nm and 200 nm in thickness.

* * * * *

UNITED STATES PATENT AND TRADEMARK OFFICE
CERTIFICATE OF CORRECTION

PATENT NO.         : 7,183,707 B2  
APPLICATION NO. : 10/822517  
DATED                 : February 27, 2007  
INVENTOR(S)       : Yuan-Sheng Tyan et al.

Page 1 of 1

It is certified that error appears in the above-identified patent and that said Letters Patent is hereby corrected as shown below:

Column 17, line 2 of claim 10.   delete "light emitting".

Column 17, line 8 of claim 10.   delete "10-7 ohm-cm$^2$" and insert --10$^{-7}$ ohm-cm$^2$;--

Signed and Sealed this

Sixteenth Day of October, 2007

JON W. DUDAS  
*Director of the United States Patent and Trademark Office*